United States Patent
Wu et al.

(10) Patent No.: US 12,300,656 B2
(45) Date of Patent: May 13, 2025

(54) SEMICONDUCTOR PACKAGE AND METHOD OF FORMING THEREOF

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/366,947

(22) Filed: Aug. 8, 2023

(65) Prior Publication Data

US 2024/0021564 A1  Jan. 18, 2024

Related U.S. Application Data

(62) Division of application No. 17/186,775, filed on Feb. 26, 2021, now Pat. No. 11,837,567.

(51) Int. Cl.
*H01L 23/00* (2006.01)
*H01L 23/14* (2006.01)
*H01L 23/31* (2006.01)

(52) U.S. Cl.
CPC .............. *H01L 24/29* (2013.01); *H01L 23/14* (2013.01); *H01L 23/3128* (2013.01); *H01L 24/05* (2013.01); *H01L 24/14* (2013.01); *H01L 24/81* (2013.01); *H01L 2224/0401* (2013.01); *H01L 2224/14104* (2013.01); *H01L 2224/2101* (2013.01); *H01L 2224/211* (2013.01); *H01L 2224/214* (2013.01);

(Continued)

(58) Field of Classification Search
CPC ..... H01L 24/20; H01L 23/14; H01L 23/3128; H01L 24/05; H01L 24/14; H01L 24/29; H01L 24/81; H01L 24/82; H01L 2224/0401; H01L 2224/14104; H01L 2224/2101; H01L 2224/211; H01L 2224/214; H01L 2224/2902; H01L 2224/8134; H01L 2224/8234; H01L 2924/35

See application file for complete search history.

(56) References Cited

U.S. PATENT DOCUMENTS 9,000,584 B2   4/2015   Lin et al.
9,048,222 B2   6/2015   Hung et al.
9,048,233 B2   6/2015   Wu et al.

(Continued)

FOREIGN PATENT DOCUMENTS

EP   3605603 A1   5/2020
WO   2019132965 A1   7/2019

*Primary Examiner* — Tucker J Wright
(74) *Attorney, Agent, or Firm* — Slater Matsil, LLP

(57) ABSTRACT

A semiconductor device includes a redistribution structure, an integrated circuit package attached to a first side of the redistribution structure and a core substrate coupled to a second side of the redistribution structure with a first conductive connector and a second conductive connector. The second side is opposite the first side. The semiconductor device further includes a top layer of the core substrate including a dielectric material and a chip disposed between the redistribution structure and the core substrate. The chip is interposed between sidewalls of the dielectric material.

20 Claims, 21 Drawing Sheets

(52) U.S. Cl.
CPC ............... *H01L 2224/2902* (2013.01); *H01L 2224/8134* (2013.01); *H01L 2224/8234* (2013.01); *H01L 2924/35* (2013.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2008/0116589 A1 | 5/2008 | Li et al. |
| 2017/0062383 A1 | 3/2017 | Yee et al. |
| 2017/0170155 A1* | 6/2017 | Yu ........................... H01L 25/50 |
| 2019/0131284 A1 | 5/2019 | Jeng et al. |

* cited by examiner

SEMICONDUCTOR PACKAGE AND METHOD OF FORMING THEREOF

PRIORITY CLAIM AND CROSS-REFERENCE

This application is a divisional of U.S. patent application Ser. No. 17/186,775, filed on Feb. 26, 2021, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
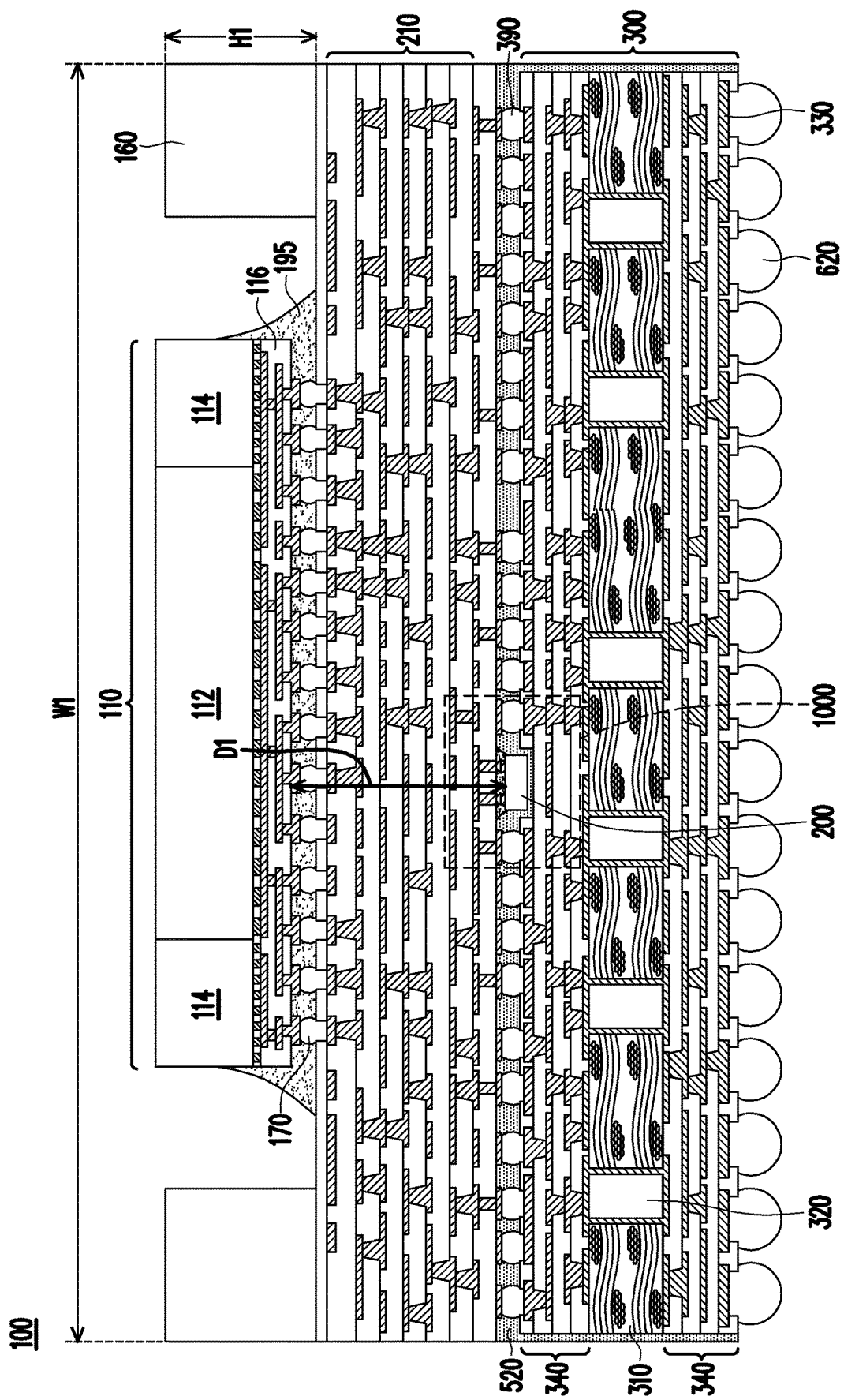
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package component including one or more integrated circuit dies. In some embodiments, the package component is a system-on-integrated-substrate (SoIS) package. The package component includes a chip such as an integrated voltage regulator (IVR) disposed between a redistribution structure and a core substrate, opposite of an integrated circuit package. The placement of the IVR between the redistribution structure and the core substrate enables a shorter distance between the integrated circuit package and the IVR, which leads to improved power integrity and better performance.

Figure 2:
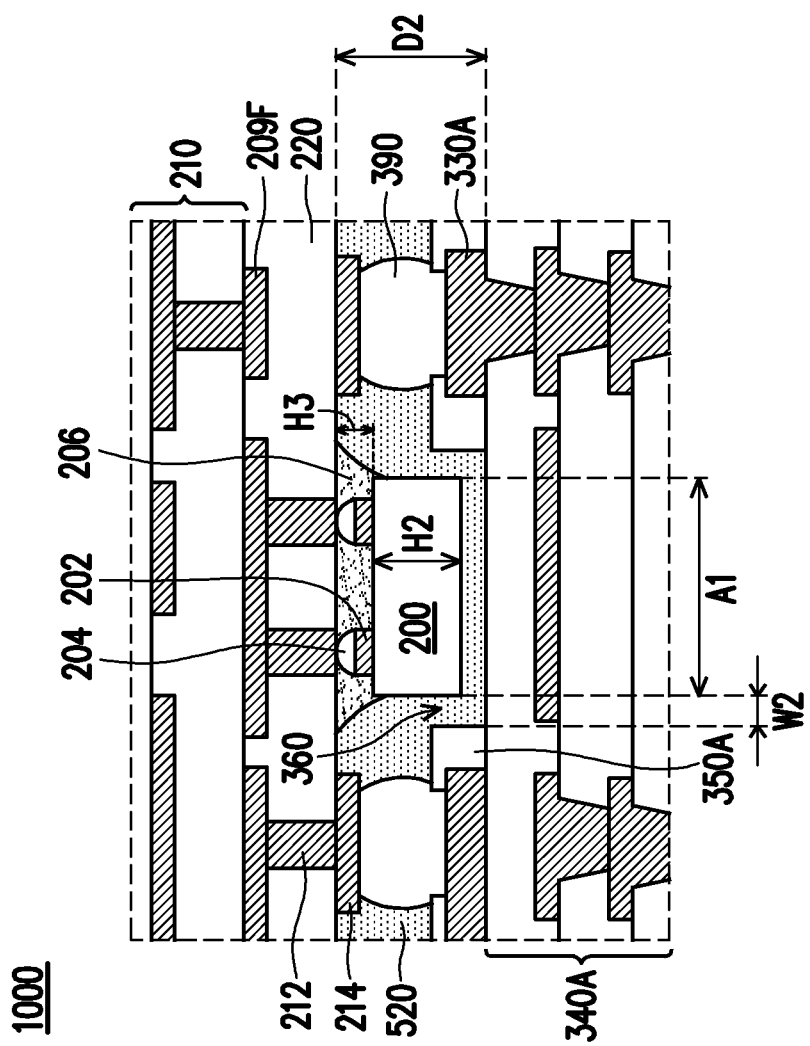
FIG. 2 illustrates a detailed view of a portion of the cross-sectional view of FIG. 1 in accordance with some embodiments.

FIG. 1 illustrates a cross-sectional view of a singulated package component 100 in accordance with some embodiments. FIG. 2 illustrates a detailed view of region woo of the cross-sectional view of FIG. 1, in accordance with some embodiments. The singulated package component 100 includes a semiconductor device (e.g., an integrated circuit package 110) coupled to a redistribution structure 210 having one or more redistribution layers by conductive connectors 170. A protective ring 160 may be coupled to the redistribution structure 210 and extend along a periphery of the integrated circuit package 110. A top surface of the protective ring 160 may be level with a top surface of the integrated circuit package 110. In some embodiments, the protective ring 160 has a height H1 measured from the top surface of the protective ring 160 to a top surface of the redistribution structure 210 in a range of 50 μm to 1500 μm. In some embodiments, the singulated package component 100 has a largest width W1 measured between opposite sidewalls in a range of 30 mm to 500 mm.

A core substrate 300 is coupled to the redistribution structure 120 on a side opposite the integrated circuit package 110 by conductive connectors 390. External connectors 620 provide an electrical connection to the core substrate 300 on a side of the core substrate 300 opposite the redistribution structure 120.

An integrated voltage regulator (IVR) 200 is disposed between the redistribution structure 210 and the core substrate 300. The IVR 200 may supply and regulate power to the integrated circuit package 110. Attaching the IVR 200 to the redistribution structure 210 opposite the integrated circuit package 110 may provide a shortest distance D1 between the IVR 200 and the integrated circuit package 110 in a range of 0.1 mm to 1.0 mm, such as in a range of 0.1 mm to 0.3 mm, which may be useful for providing a more efficient voltage domain with mitigated voltage and power drops that can improve power integrity for the integrated circuit package 110. The improved power integrity may be able to increase operation frequency and lower supply voltage in order to meet high performance computing (HPC) requirements. By packaging the IVR 200 between the redistribution structure 210 and the core substrate 300, a compact system can be achieved that may provide higher SoIS yield due to being fabricated with existing silicon fabrication tools and processes.

The distance D1 being in the range of 0.1 mm to 1.0 mm may provide the advantages described above, such as improved power integrity for the integrated circuit package 110. The distance D1 being less than 0.05 mm may be disadvantageous because it may lead to adverse thermal impact on the integrated circuit package 110. The distance D1 being greater than 1.0 mm may be disadvantageous because it may lead to voltage and power drops in the integrated circuit package 110, which may reduce device performance.

The integrated circuit package 110 may include a plurality of integrated circuit dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an input/output (I/O) die, the like, or combinations thereof. As shown, the integrated circuit package 110 includes an SoC 112 and two I/O dies 114 for illustrative purposes. The integrated circuit dies may be formed in one or more wafers, which may include different device regions that are singulated in subsequent steps. The integrated circuit dies may be packaged with other similar or different integrated circuit dies using manufacturing techniques such as an InFO package. The integrated circuit package 110 may include a redistribution structure 116, providing electrical pathing and connection between, for example, the SoC 112 and the I/O dies 114, as well as connection from the integrated circuit package to conductive connectors 170.

Conductive connectors 170 provide the electrical connection between the redistribution structure 120 and the integrated circuit package 110. An underfill 195 may be included to securely bond the integrated circuit package 110 to the redistribution structure 120 and provide structural support and environmental protection.

As discussed in greater detail below, the redistribution structure 210 provides electrical pathing and connection between the integrated circuit package 110 and the core substrate 300 through conductive connectors 170 and 390. In some embodiments, the redistribution structure 210 has one or more redistribution layers comprising metallization patterns, comprising, for example, conductive lines and conductive vias, and dielectric layers separating adjacent layers of the conductive lines as discussed below, for example, in relation to FIGS. 4-5. The conductive lines of metallization patterns may be interconnected with an overlying or underlying conductive feature using the conductive vias.

The redistribution structure 210 is electrically and mechanically attached to the core substrate 300. The core substrate 300 may include a core 310, with conductive vias 320 extending through the core 310, and additional optional redistribution structures 340 along opposing sides of the core 310. In some embodiments, the core 310 has a thickness between a top surface and a bottom surface of the central core in a range of 30 µm to 2,000 µm. Generally, the core substrate 300 provides structural support for the component package, as well as providing electrical signal routing between the integrated circuit package 110 and the external connectors 620, which may be physically and electrically coupled to under-bump metallurgies (UBMs) 330 on a bottom surface of the lower redistribution structure 340.

Encapsulant 520 may be included between the redistribution structure 210 and the core substrate 300 to securely bond the associated elements and provide structural support and environmental protection. The encapsulant 520 may be formed of or comprise an organic material such as a molding compound, a molding underfill, an epoxy, a resin, or the like.

As shown in greater detail in FIG. 2, the IVR 200 is attached to an underside of the redistribution structure 210 above the core substrate 300. The IVR 200 may have a height H2 in a range of 20 µm to 100 µm. A side of the IVR 200 opposite the redistribution structure 210 may have a surface area in a range of 500 $µm^2$ to 20,000 $µm^2$. In some embodiments, the IVR 200 is attached to vias 212 extending through a dielectric layer 220 to contact a redistribution layer 209F of the redistribution structure 210, and conductive connectors 390 on UBMs 330A of the core substrate 300 are coupled to UBMs 214 on the vias 212. In other embodiments, the vias 212 and the dielectric layer 220 are not present and the IVR 200 and connective connectors 390 are physically and electrically coupled to conductive features of the redistribution layer 209F of the redistribution structure 210.

The IVR 200 may be coupled to the vias 212 by conductive connectors 202 on a top surface of the IVR 200. The conductive connectors 202 may be coupled to the vias 212 by solder regions 204, such as e.g. micro bumps. However, any suitable conductive connectors may be used to couple the IVR 200 with the vias 212 or with conductive features of the redistribution structure 210. In some embodiments, the conductive connectors 202 and the solder regions 204 have a height H3 in a range of 10 µm to 25 µm. An underfill 206 may be disposed over the dielectric layer 220 around the conductive connectors 202 and solder regions 204. The underfill 206 may be formed surrounding the conductive connectors 202 and solder regions by a capillary flow process or another suitable deposition method between the IVR 200 and the dielectric layer 220. The underfill 206 may reduce stress on the conductive connectors 202. The material of the underfill 206 may be a liquid epoxy, deformable gel, silicon rubber, a combination thereof.

The IVR 200 may be disposed in an opening 360 in a top surface of the core substrate 300, such as e.g. in a solder resist 350A, over a top surface of a redistribution structure 340A of the core substrate 300. The opening 360 may be formed through the solder resist 350A (see below, FIG. 12) in order to provide a space for the IVR 200 to fit between the redistribution structure 210 and the core substrate 300. This position of the IVR 200 may provide a more efficient voltage domain with mitigated voltage and power drops that can improve power integrity for subsequently attached integrated circuit packages 110 (see below, FIG. 18). The opening 360 may be filled by the IVR 200 and the encapsulant 520. The opening 360 may have a width W2 between opposing sidewalls of the solder resist 350A and the IVR 200, respectively, in a range of 5 µm to 200 µm, which may be useful for providing space for the IVR 200 to fit between the redistribution structure 210 and the core substrate 300 to improve power integrity for the integrated circuit package 110. The width W2 being less than 5 µm may be disadvantageous for not providing sufficient space to fit the IVR 200. The width W2 being greater than 200 µm may be disadvantageous because it may lead to fewer conductive connectors 390 coupling the redistribution structure 210 and the core substrate 300, which may decrease device performance.

A distance D2 measured between opposite surfaces of the redistribution structure 340A of the core substrate 300 and the dielectric layer 220 in a range of 147 µm to 500 µm, which may be useful for providing space for the IVR 200 to fit between the redistribution structure 210 and the core substrate 300 to improve power integrity for the integrated circuit package 110. A distance D2 less than 147 µm may be disadvantageous for not providing sufficient space to fit the IVR 200. A distance D2 greater than 500 µm may be disadvantageous because it may lead to worse connection between the redistribution structure 210 and the core substrate 300 with higher resistance in the conductive connectors 390, which may decrease device performance.

FIGS. 3 through 15, 18, and 19 illustrate cross-sectional views of intermediate steps during a process for forming the package component 100, in accordance with some embodiments. A first package region 100A and a second package region 100B are illustrated, and one or more of the IVRs 200 are packaged to form a package component in each of the package regions 100A and 100B. The illustrations of the individual features have been simplified in FIGS. 3 through 19 for ease of illustration.

Figure 3:
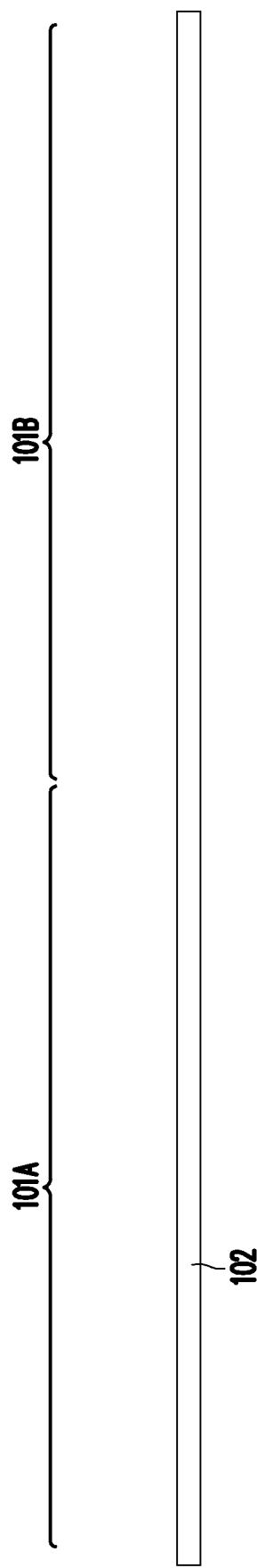
FIGS. 3 through 15, 18, and 19 illustrate cross-sectional views of intermediate steps during a process for forming a package component in accordance with some embodiments.

In FIG. 3, a carrier substrate 102 is provided. The carrier substrate 102 may include, for example, silicon-based materials, such as a silicon substrate (e.g., a silicon wafer), a glass material, silicon oxide, or other materials, such as aluminum oxide, the like, or a combination. In some embodiments, the carrier substrate 102 may be a panel structure, which may be, for example, a supporting substrate formed from a suitable dielectric material, such as a glass material or an organic material, and which may have a rectangular shape. The carrier substrate 102 may be planar in order to accommodate the formation of additional features, such as the insulating layer 103.

In some embodiments, a release layer (not illustrated) may be formed on the top surface of the carrier substrate 102 to facilitate subsequent debonding of the carrier substrate 102. The release layer may be formed of a polymer-based material, which may be removed along with the carrier substrate 102 from the overlying structures that will be formed in subsequent steps. In some embodiments, the release layer is an epoxy-based thermal-release material, which loses its adhesive property when heated, such as a Light-to-Heat-Conversion (LTHC) release coating. In other embodiments, the release layer may be an ultra-violet (UV) glue, which loses its adhesive property when exposed to UV light. The release layer may be dispensed as a liquid and cured, may be a laminate film laminated onto the carrier substrate 102, or the like. The top surface of the release layer may be leveled and may have a high degree of co-planarity.

Figure 4:
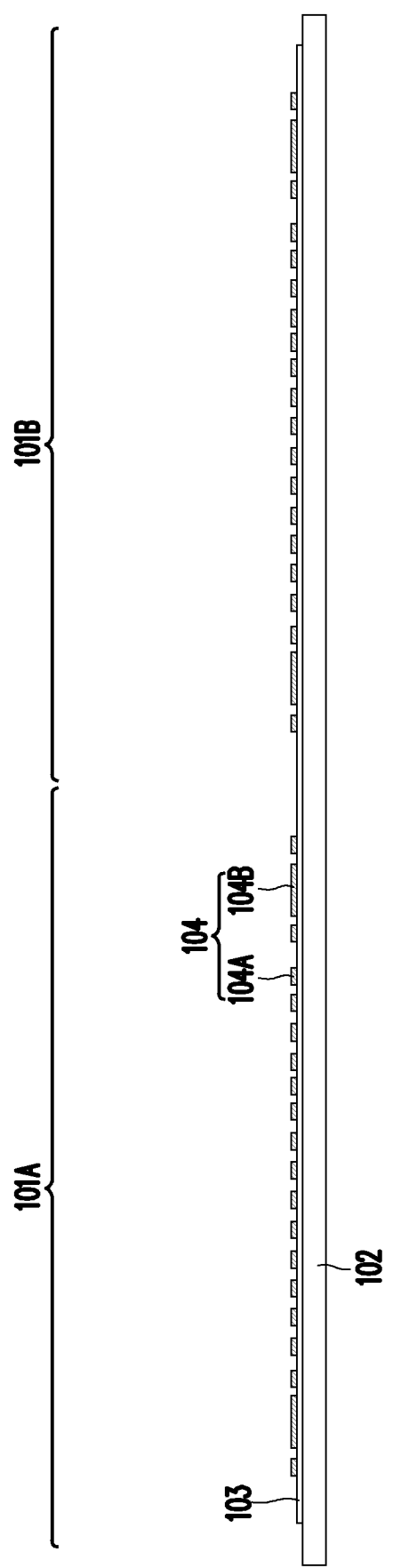
Figure 5:
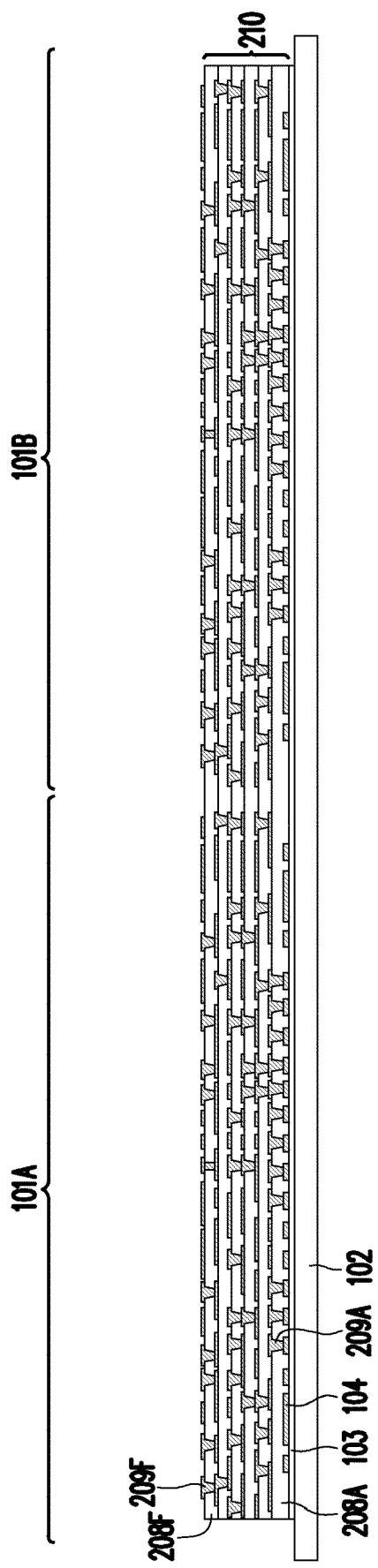

FIGS. 4 and 5 illustrate the formation of a redistribution structure 210 on the carrier substrate 102. FIG. 4 shows the formation of an insulating layer 103 and a redistribution layer 104 of the redistribution structure 210, and FIG. 5 shows the formation of insulating layers 208A-F and redistribution layers 209A-F of the redistribution structure 210.

In FIG. 4, an insulating layer 103 may be formed over the carrier substrate 102. The bottom surface of the insulating layer 103 may be in contact with the top surface of the release layer (not illustrated). In some embodiments, the insulating layer 103 is formed of a polymer, such as polybenzoxazole (PBO), polyimide, benzocyclobutene (BCB), or the like. In other embodiments, the insulating layer 103 is formed of a nitride such as silicon nitride; an oxide such as silicon oxide, phosphosilicate glass (PSG), borosilicate glass (BSG), boron-doped phosphosilicate glass (BPSG), or the like; or the like. The insulating layer 103 may be formed by any acceptable deposition process, such as spin coating, CVD, laminating, the like, or a combination thereof. In some embodiments, the insulating layer 103 has a thickness in a range of 5 µm to 50 µm, although any suitable thickness may be used In FIG. 4, a redistribution layer 104 may be formed by initially forming a seed layer (not shown) of one or more layers of titanium, copper, or a titanium-copper alloy using a suitable formation process such as PVD, CVD, sputtering, or the like. In some embodiments, the redistribution layer 104 includes contact pads 104A, which may be landing sites for subsequently formed connectors (see below, FIG. 15), and conductive lines 104B. The seed layer is formed over the carrier substrate 102 or the insulating layer 103, if present. A photoresist (also not shown) may then be formed to cover the seed layer and then be patterned to expose those portions of the seed layer that are located where the redistribution layer 104 will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating or electroless plating, or the like. However, while the material and methods discussed are suitable to form the conductive material, these are merely examples. Any other suitable materials or any other suitable processes of formation, such as CVD or PVD, may alternatively be used to form the redistribution layer 104. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the redistribution layer 104. In some embodiments, the conductive material of the redistribution layer 104 has a thickness in a range of 2 µm to 50 µm, although any suitable thickness may be used.

Next, in FIG. 5, additional layers of the redistribution structure 210 are formed over the redistribution layer 104, the insulating layer 103, and the carrier substrate 102, in accordance with some embodiments. The redistribution structure 210 shown includes the insulating layer 103, the redistribution layer 104, insulating layers 208A-F (for clarity, only insulating layers 208A and 208F are labeled) and includes redistribution layers 209A-F (for clarity, only redistribution layers 209A and 209F are labeled). In other embodiments, different numbers of insulating layers or redistribution layers may be formed in the redistribution structure 210 than described herein. In some embodiments, the redistribution structure 210 may be formed in a different process than that described herein. In some embodiments, the redistribution structure 210 may be, for example, a fan-out structure.

Still referring to FIG. 5, the insulating layer 208A is formed over the redistribution layer 104 and the insulating layer 103. The insulating layer 208A may be made of one or more suitable dielectric materials such as an oxide (e.g., silicon oxide), a nitride (e.g., silicon nitride), a polymer material (e.g., a photosensitive polymer material), a polyimide material, a low-k dielectric material, another dielectric material, the like, or a combination thereof. The insulating layer 208A may be formed by a process such as spin-coating, lamination, CVD, the like, or a combination thereof. In some embodiments, the insulating layer 208A has a thickness in a range of 5 µm to 50 µm, although any suitable thickness may be used. Openings into the insulating layer 208A may be formed using a suitable photolithographic mask and etching process. For example, a photoresist may be formed and patterned over the insulating layer 208A, and one or more etching processes (e.g., a wet etching process or a dry etching process) are utilized to remove portions of the insulating layer 208A. In some embodiments, the insulating layer 208A is formed of a photosensitive polymer such as PBO, polyimide, BCB, or the like, in which openings may be patterned directly using a photolithographic mask and etching process. The openings in the insulating layer 208A may expose the redistribution layer 104.

The redistribution layer 209A may then be formed to provide additional routing along with electrical connection within the redistribution structure 210. In an embodiment, the redistribution layer 209A may be formed using materials and processes similar to the redistribution layer 104. For example, a seed layer may be formed, a photoresist placed and patterned on top of the seed layer in a desired pattern for the redistribution layer 209A. Conductive material (e.g., copper, titanium, or the like) may then be formed in the patterned openings of the photoresist using e.g., a plating process. The photoresist may then be removed and the seed layer etched, forming redistribution layer 209A. In this manner, the redistribution layer 209A may form electrical connections to the redistribution layer 104. In some embodiments, the conductive material of the redistribution layer 209A has a thickness in a range of 2 µm to 50 µm, although any suitable thickness may be used.

Additional insulating layers 208B-F and redistribution layers 209B-F may then be formed over the redistribution layer 209A and insulating layer 208A to provide additional routing along with electrical connection within the redistribution structure 210. The insulating layers 208B-F and redistribution layers 209B-F may be formed in alternating layers, and may be formed using processes and materials similar to those used for the insulating layer 208A or the redistribution layer 209A. For example, an insulating layer (e.g., insulating layer 208B) may be formed over a redistribution layer (e.g., redistribution layer 209A), and then openings made through the insulating layer to expose portions of the underlying redistribution layer using a suitable photolithographic mask and etching process. A seed layer may be formed over the insulating layer and conductive material formed on portions of the seed layer, forming an overlying redistribution layer (e.g., redistribution layer 209B). These steps may be repeated to form a redistribution structure 210 having a suitable number and configuration of insulation layers and redistribution layers. Alternatively, the insulating layer 208B-F or redistribution layers 209B-F may be formed differently than the insulating layer 208A or redistribution layer 209A. The insulating layers 208B-F may be formed to each have a thickness in a range of 5 µm to 50 µm, although any suitable thickness may be used. In this manner, the redistribution structure 210 may be formed that is electrically connected to the redistribution layer 104. In some embodiments, the redistribution structure 210 is a fan-out structure. In other embodiments, the redistribution structure 210 may be formed in a different process than described herein.

Figure 6:
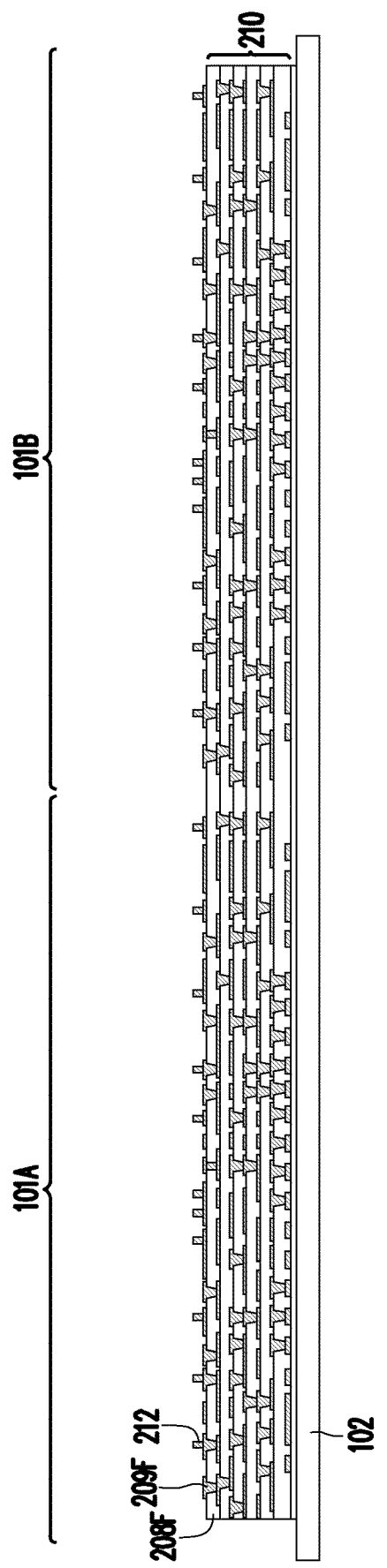

Next, in FIG. 6, vias 212 are formed on conductive features of the redistribution layer 209F. The vias 212 may provide electrical connection through the subsequently formed dielectric layer 220 (see below, FIG. 7) for subsequently attached IVRs 200 (see below, FIGS. 10A-B) and core substrates 300 (see below, FIG. 13. As an example to form the vias 212, a photoresist is formed and patterned on the insulating layer 208F and the redistribution layer 209F. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the redistribution layer 209F, forming the vias 212. The conductive material may be formed by plating, such as electroplating or electroless plating, or the like. The conductive material may comprise a metal, like copper, titanium, tungsten, aluminum, or the like. The photoresist is removed, such as by an acceptable ashing or stripping process, such as using an oxygen plasma or the like.

Figure 7:
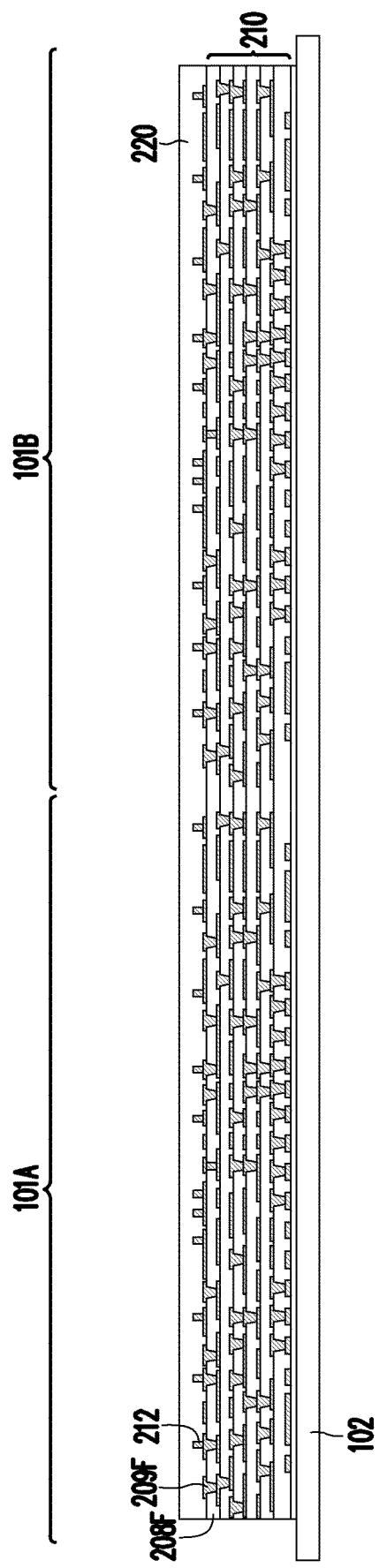

In FIG. 7, a dielectric layer 220 is formed over the redistribution structure 210 and the vias 212. The dielectric layer 220 may be useful for providing a surface on which to subsequently attach the IVRs 200 (see below, FIGS. 10A-B). In some embodiments, the dielectric layer 220 is formed of a polymer, such as polybenzoxazole (PBO), polyimide, benzocyclobutene (BCB), or the like. In other embodiments, the dielectric layer 220 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 220 may be formed by any acceptable deposition process, such as laminating, spin coating, CVD, the like, or a combination thereof.

Figure 8:
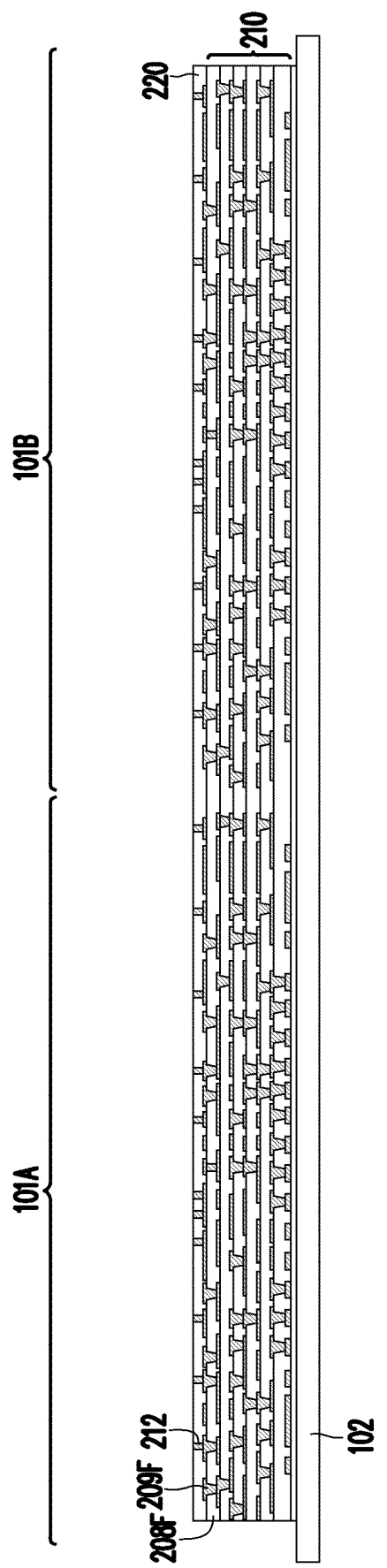

In FIG. 8, a planarization such as a grinding or a chemical mechanical polish is performed to expose top surfaces of the vias 212 by removing a top portion of the dielectric layer 220. Exposing the top surfaces of the vias 212 allows subsequently formed UBMs 214 (see below, FIG. 9) and subsequently attached IVRs 200 to physically and electrically couple to the vias 212.

Figure 9:
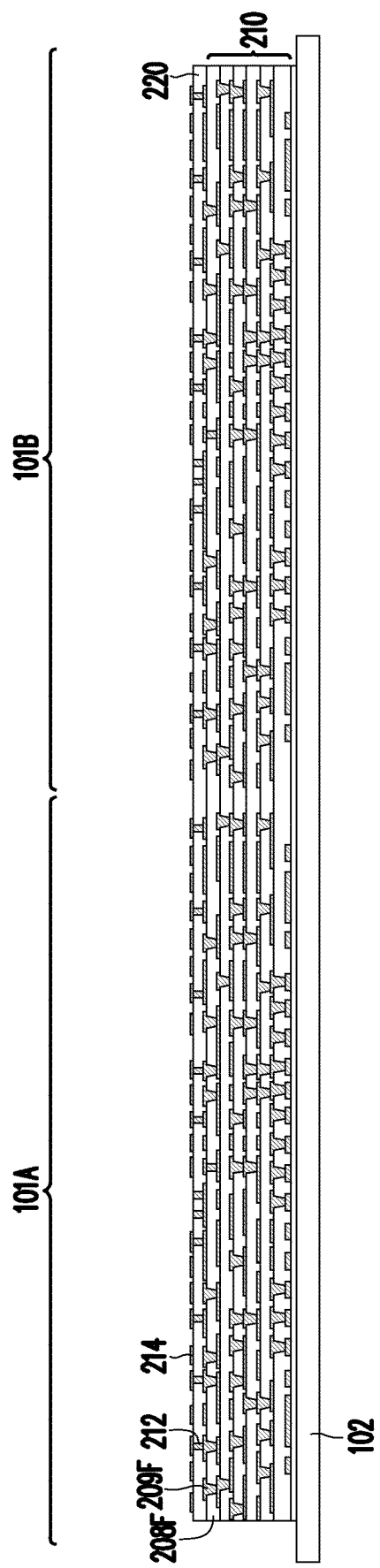

Next, in FIG. 9, UBMs 214 are formed on the dielectric layer 220 and physically and electrically coupled to some of the vias 212. The UBMs 214 may provide landing sites for subsequently formed conductive connectors 390 to couple the redistribution structure 210 with core substrates 300 (see below, FIG. 13). The UBMs 214 may be formed of the same material as the vias 212.

Figure 10A:
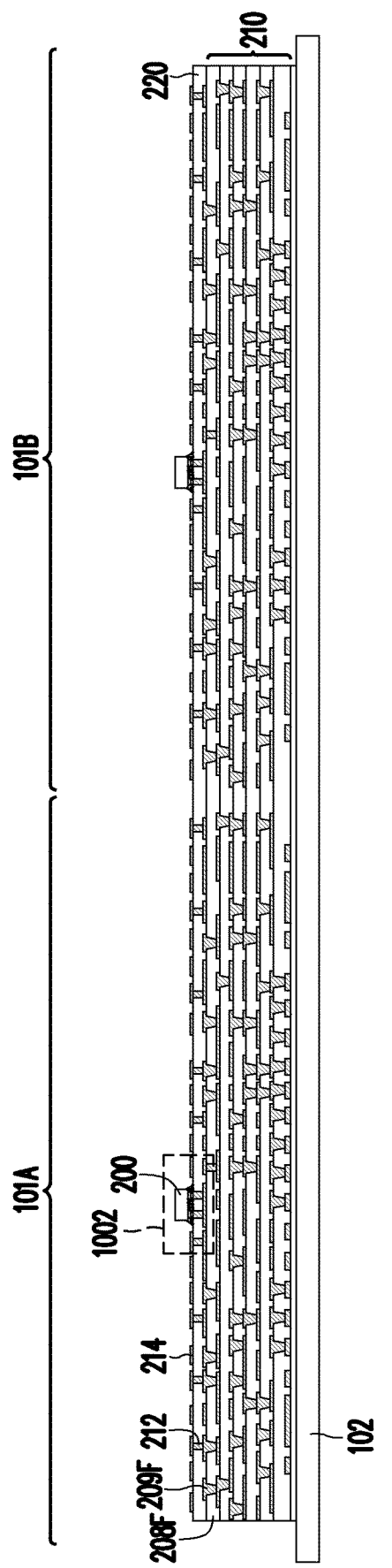
Figure 10B:
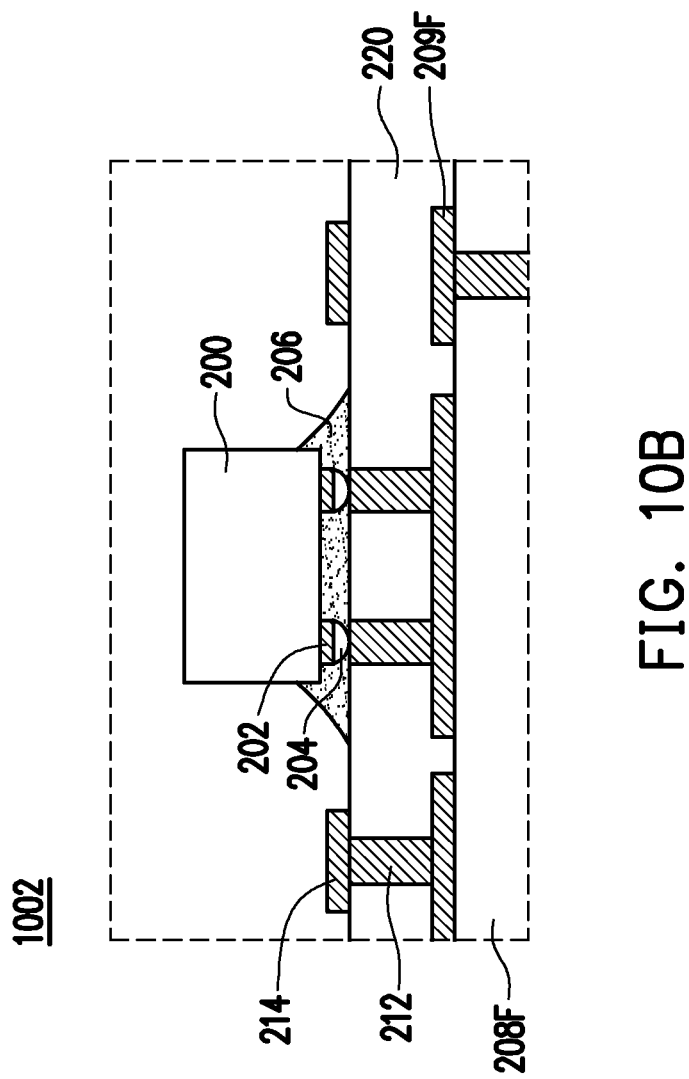

In FIGS. 10A and 10B, IVRs 200 are attached to the dielectric layer 220 on the redistribution structure 210 and coupled to vias 212 not covered by UBMs 214. FIG. 10B illustrates a detailed view of region 1002 of FIG. 10A. In some embodiments, the IVRs 200 may be placed on the dielectric layer 220 using a pick and place process or another suitable process and the solder regions 204 bonded to top surfaces of the vias 212 by flip chip bonding process or other suitable bonding process. By bonding the conductive connectors 202 to the vias 212 directly, more space can be provided for the IVRs 200 between the redistribution structure 210 and the subsequently attached core substrates 300 (see below, FIG. 13).

An underfill 206 may be disposed on a surface of dielectric layer 220 around the conductive connectors 202 and the solder regions 204. The underfill 206 may be formed surrounding the conductive connectors 202 by a capillary flow process or another suitable deposition method between the IVRs 200 and the dielectric layer 220. The underfill 206 may reduce stress on the conductive connectors 202 and the solder regions 204. The material of the underfill 206 may be a liquid epoxy, deformable gel, silicon rubber, a combination thereof.

In some embodiments, the formation of the vias 212 and the dielectric layer 220 may be omitted. The IVRs 200 may then be physically and electrically coupled directly to conductive features of the redistribution layer 209F. Subsequently formed conductive connectors 390 (see below, FIG. 13) may be formed on other conductive features of the redistribution layer 209F.

Figure 11:
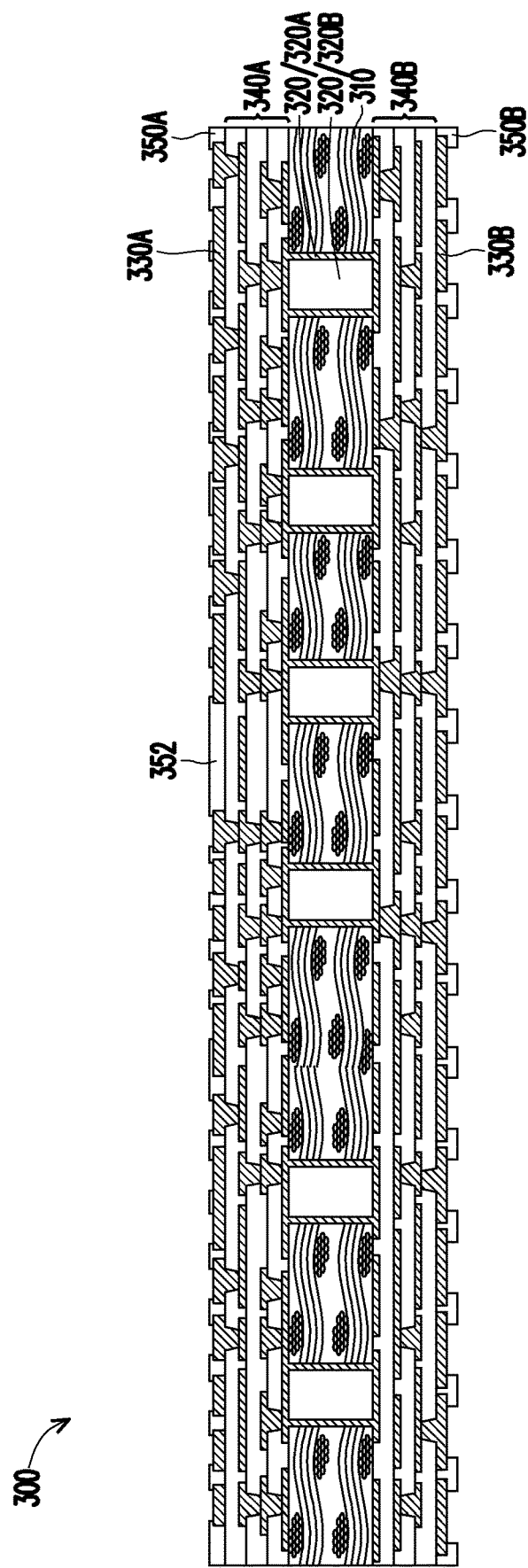

FIG. 11 illustrates a core substrate 300, which is subsequently bonded to the redistribution structure 210 (see below, FIG. 13). Utilizing the core substrate 300 has the advantage of having the core substrate 300 being manufactured in a separate process. In addition, because the core substrate 300 is formed in a separate process, it can be tested separately so that a known good core substrate 300 is used. For example, in some embodiments, the core substrate 300 may be individually or batch tested, validated, and/or verified prior to bonding the core substrate 300 to the redistribution structure 210.

The core substrate 300 may be, e.g., an organic substrate, a ceramic substrate, a silicon substrate, or the like. Subsequently formed conductive connectors 390 (see FIG. 12) are used to attach the core substrate 300 to the redistribution structure 210. Attaching the core substrate 300 may include placing the core substrate 300 on the redistribution structure 210 and reflowing the conductive connectors 390 to physically and electrically couple the core substrate 300 and the redistribution structure 210.

Before being attached to the redistribution structure 210, the core substrate may be processed according to applicable manufacturing processes to form redistribution structures in the core substrate 300. For example, the core substrate 300 includes a core 310. The core 310 may be formed of one or more layers of glass fiber, resin, filler, pre-preg, epoxy, silica filler, Ajinomoto Build-up Film (ABF), polyimide, molding compound, other materials, and/or combinations thereof. In some embodiments, for example, two layers are of material make up the core 310. The core 310 may be formed of organic and/or inorganic materials. In some embodiments, the core 310 includes one or more passive components (not shown) embedded inside. The core 310 may comprise other materials or components. Conductive vias 320 are formed extending through the core 310. The conductive vias 320 comprise a conductive material 320A such as copper, a copper alloy, or other conductors, and may include a barrier layer (not shown), liner (not shown), seed layer (not shown), and/or a fill material 320B, in some embodiments. The conductive vias 320 provide vertical electrical connections from one side of the core 310 to the other side of the core 310. For example, some of the conductive vias 320 are coupled between conductive features at one side of the core 310 and conductive features at an opposite side of the core 310. Holes for the conductive vias 320 may be formed using a drilling process, photolithography, a laser process, or other methods, as examples, and the holes of the conductive vias 320 are then filled or plated with conductive material. In some embodiments, the conductive vias 320 are hollow conductive through vias having centers that are filled with an insulating material. Redistribution structures 340A and 340B are formed on opposing sides of the core 310. The redistribution structures 340A and 340B are electrically coupled by the conductive vias 320, which may carry fan-in/fan-out electrical signals.

The redistribution structures 340A and 340B each include dielectric layers, formed of ABF, pre-preg, or the like, and metallization patterns. Each respective metallization pattern has line portions on and extending along a major surface of a respective dielectric layer, and has via portions extending through the respective dielectric layer. In some embodiments, the respective dielectric layers have thicknesses in a range of 5 μm to 50 μm and the respective metallization patterns have thicknesses in a range of 2 μm to 50 μm, although any suitable thicknesses may be used. The redistribution structures 340A and 340B each, respectively, include under-bump metallurgies (UBMs) 330A and 330B for external connection, and solder resists 350A and 350B protecting the features of the redistribution structures 340A and 340B. The redistribution structure 340A may subsequently be attached to the redistribution structure 210 by the UBMs 330A through the conductive connectors 390 as illustrated below in FIG. 13. More or fewer dielectric layers and metallization patterns may be formed in the redistribution structures 340A and 340B than shown in FIG. 11.

The core substrate 300 may include active and passive devices (not shown), or may be free from either active devices, passive devices, or both. A wide variety of devices such as transistors, capacitors, resistors, inductors, combinations of these, and the like may be used. The devices may be formed using any suitable methods.

The solder resist 350A may include regions 352 formed directly over areas of the redistribution structure 340A without UBMs 330A present. These regions 352 may subsequently be removed to form openings 360 (see below, FIG. 12) to accommodate the IVRs 200 when the core substrates 300 are attached to the redistribution structure 210.

Figure 12:
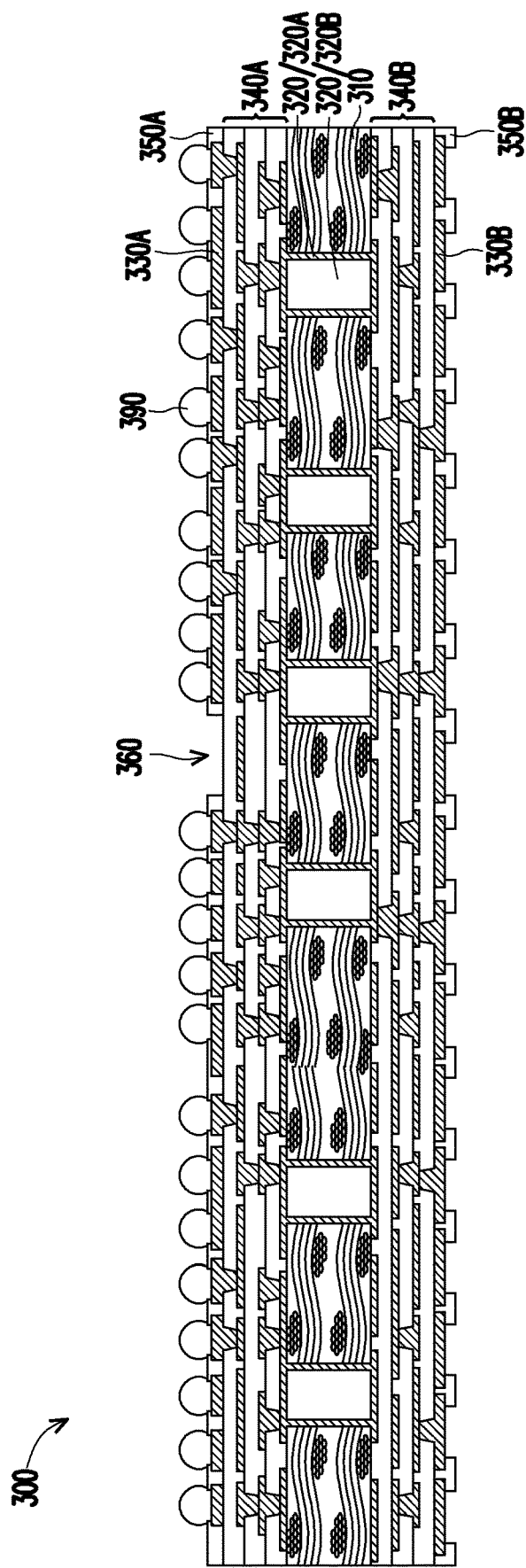

In FIG. 12, the regions 352 of the solder resist 350A are removed to form openings 360 and conductive connectors 390 are formed on the UBMS 330A. In some embodiments, the solder resist 350A comprises one or more layers of photo-patternable insulating materials such as polybenzoxazole (PBO), polyimide (PI), benzocyclobutene (BCB), or the like, and may be formed using a spin-on coating process, or the like. Such photo-patternable dielectric materials may be patterned using similar photolithography methods as a photoresist material to remove regions 352 and form openings 360. However, any suitable method may be used to form the openings 360. In some embodiments, a portion of conductive material such as e.g. Cu of the UBMs 330 is present in the regions 352 and is also removed by a suitable process such as an etching.

Conductive connectors 390 may be used to bond the core substrates 300A and 300B to the redistribution structure 210 as illustrated below in FIG. 13. Conductive connectors 390 may be first formed on either the core substrates 300A and 300B, or on the UBMs 214 of the redistribution structure 210 (see above, FIG. 9), and then reflowed to complete the bond. For example, in the embodiment shown in FIG. 12, conductive connectors 390 are formed on UBMs 330A of the top redistribution structure 340A with a pitch in a range of 100 μm to 1,500 μm. The conductive connectors 390 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 390 may include a conductive material such as solder, copper, aluminum, gold, nickel, silver, palladium, tin, the like, or a combination thereof.

Integration of such conductive connectors 390 may provide flexibility in placement for semiconductor devices, such as integrated passive device (IPD) chips, integrated voltage regulators (IVRs), active chips, among other electrical components, to implement system-on-a-chip type of package components, thus reducing fabrication complexity. Such embodiments may also provide a greater amount of flexibility for various other package configurations as well.

In some embodiments, the conductive connectors 390 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 390 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 13:
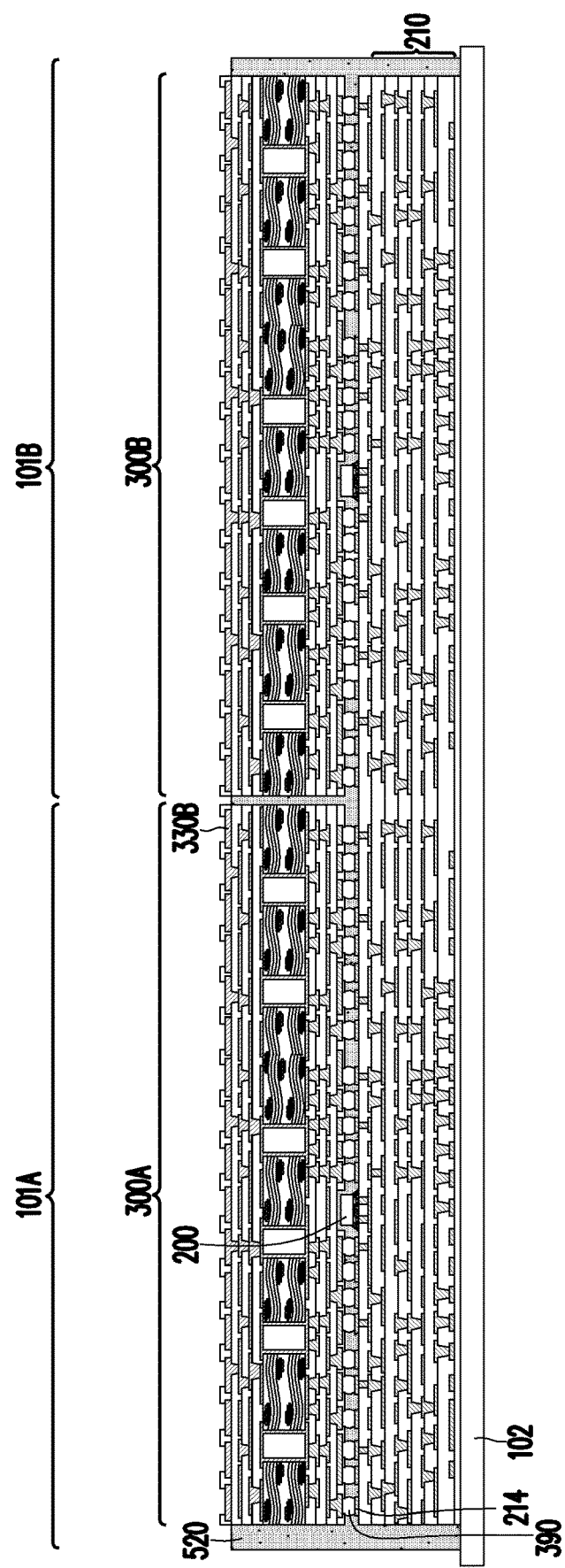

In FIG. 13, core substrates 300A and 300B are bonded to the redistribution structure 210 (see above, FIG. 10A) in first package region 101A and second package region loth, respectively, and an encapsulant 520 is formed on and around the various components. In some embodiments, the core substrates 300A and 300B may be placed on the redistribution structure 210 using a pick and place process or another suitable process and the conductive connectors 390 bonded by flip chip bonding process or other suitable bonding process. In some embodiments, the conductive connectors 390 are reflowed to attach the core substrates 300A and 300B to the redistribution structure 210 by way of UBMs 214. The conductive connectors 390 electrically and/or physically couple the core substrates 300A and 300B through the redistribution structure 210 to subsequently attached integrated circuit packages 110 (see below, FIG. 18). The conductive connectors 390 may have an epoxy flux (not shown) formed thereon before they are reflowed with at least some of the epoxy portion of the epoxy flux remaining after the core substrates 300A and 300B are attached to the redistribution structure 210.

The IVRs 200 may fit into the openings 360 in the core substrates 300A and 300B in order to fit between the redistribution structure 210 and the core substrates 300A and 300B to improve power integrity for subsequently attached integrated circuit packages 110 (see below, FIG. 18).

Still referring to FIG. 13, an encapsulation is performed by forming the encapsulant 520 on and around the various components. After formation, the encapsulant 520 surrounds the core substrates 300A and 300B, including conductive connectors 390, IVRs 200, and the upper exposed surface of dielectric layer 220. The encapsulant 520 may be formed of or including a molding compound, epoxy, an underfill, a molding underfill, the like, or a combination thereof and may be applied by compression molding, transfer molding, or the like. The encapsulant 520 may be applied in liquid or semi-liquid form and then subsequently cured. The encapsulant 520 may be formed over various components such that core substrates 300A and 300B are buried or covered. Sidewalls of the IVRs 200 and bottom surfaces of the IVRs 200 opposite the redistribution structure 210 may be covered by the encapsulant 520.

Further referring to FIG. 13, a planarization process may be performed, if necessary, on the encapsulant 520 to expose the UBMs 330B of the core substrates 300A and 300B. Topmost surfaces of the encapsulant 520 and UBMs 330B are level (e.g., planar) after the planarization process within process variations. The planarization process may be, for example, a chemical-mechanical polish (CMP), a grinding process, or the like. In some embodiments, the planarization may be omitted, for example, if the UBMs 330B are already exposed. Other processes may be used to achieve a similar result. For example, a dielectric or passivation layer may be formed over UBMs 330 prior to forming the encapsulant 520. In such cases, the dielectric or passivation layer may be patterned in a subsequent step to expose portions of the UBMs 330B.

Figure 14:
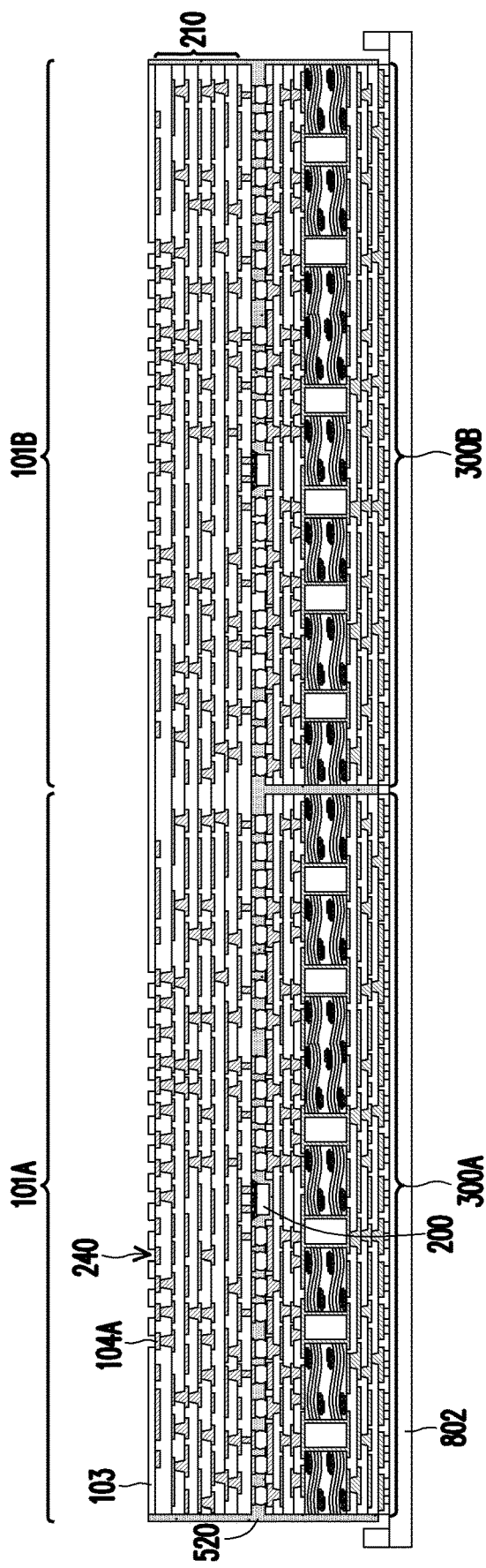
Figure 15:
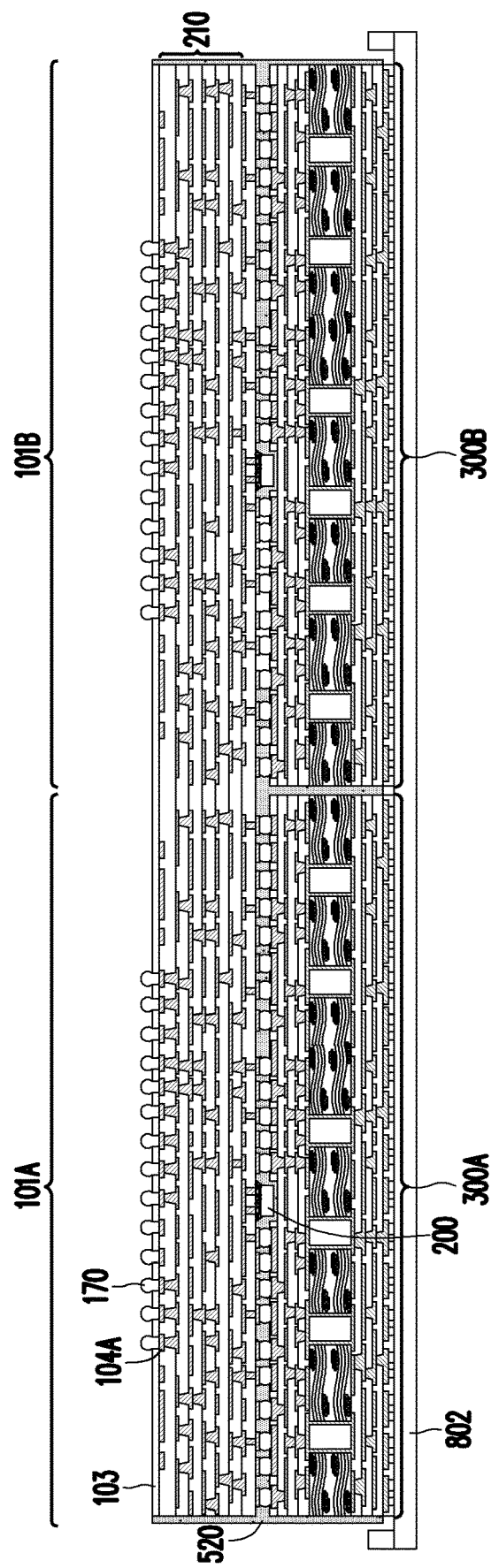

In FIG. 14, a carrier substrate de-bonding is performed to detach (or "de-bond") the carrier substrate 102 from the resulting build-up of the previously described steps comprising the core substrates 300A and 300B and the redistribution structure 210, among other structures. In accordance with some embodiments, the de-bonding includes projecting a light such as a laser light or an UV light on the release layer of the carrier substrate 102 (see above, FIG. 3) so that the release layer decomposes under the heat of the light and the carrier substrate 102 can be removed. The structure is then flipped over and placed on another carrier substrate 802 and release layer (not illustrated).

Still referring to FIG. 14, openings 240 are formed in the insulating layer 103 of the redistribution structure 210, exposing the contact pads 104A. The openings 240 may be formed by etching, a drilling process such as laser drilling, mechanical drilling, or the like. The patterning forms openings exposing the contact pads 104A. The patterning may be by an acceptable process, such as by exposing and developing the insulating layer 103 to light when the insulating layer 103 is a photosensitive material or by etching using, for example, an anisotropic etch when using a non-photosensitive material such as silicon oxide, silicon nitride, or the like.

Conductive connectors 170 may be used to bond the redistribution structure 210 to an integrated circuit package 110 (see below, FIG. 18) and may be first formed on either the integrated circuit package 110 or the redistribution structure 210, and then reflowed to complete the bond. For example, in the embodiment shown in FIG. 15, conductive connectors 170 are first formed in the openings 240 (see above, FIG. 14) coupled to the exposed contact pads 104A. The conductive connectors 170 may be ball grid array (BGA) connectors, solder balls (as shown), metal pillars, controlled collapse chip connection (C4) bumps, micro bumps, electroless nickel-electroless palladium-immersion gold technique (ENEPIG) formed bumps, or the like. The conductive connectors 170 may include a conductive material such as s older, copper, aluminum, gold, nickel, silver, palladium, tin, the like, or a combination thereof. In some embodiments, the conductive connectors 170 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 170 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
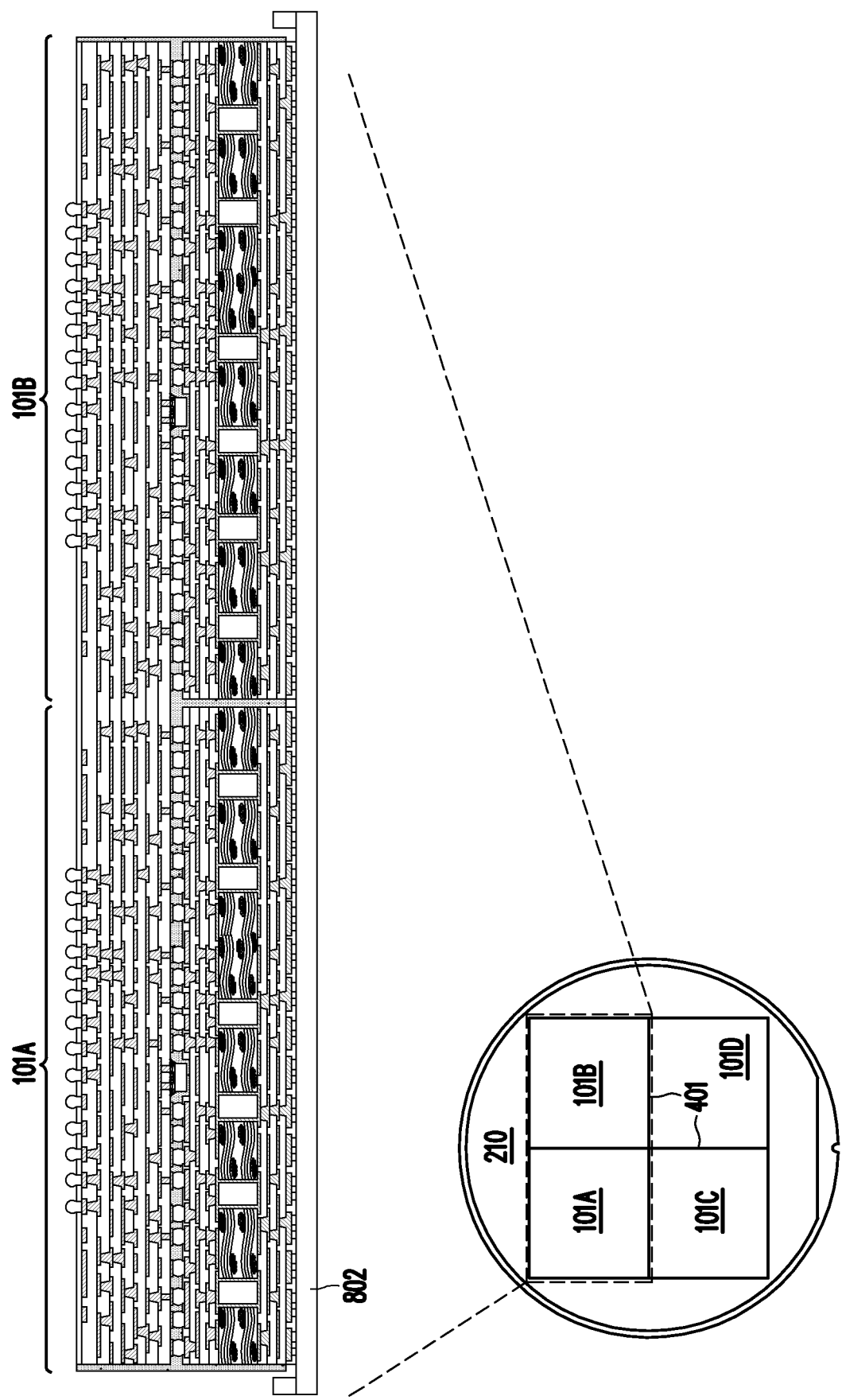
FIG. 16 illustrates a planar view of the layout of package regions on a wafer substrate in accordance with some embodiments.

As discussed above, the redistribution structure 210 may be larger and include multiple package regions, such as the first package region 101A and second package region loth. For example, FIG. 16 illustrates the redistribution structure 210 as illustrated above in FIG. 15 having a circular wafer shape with multiple package regions. In the embodiment shown, four package regions 101A, 101B, 101C, and 101D are included on the wafer allowing for four final package components to be fabricated on a single wafer and later singulated. Fewer or more package regions may be utilized on a single wafer in other embodiments. Subsequent steps in the process use the redistribution structure 210 on a carrier substrate 802 as the base upon which to continue the fabrication process described in further detail below. As described in further detail below, the individual package regions are singulated by sawing along lines 401 and around the outer edges of package regions 101A, 101B, 101C, and 101D.

Figure 17:
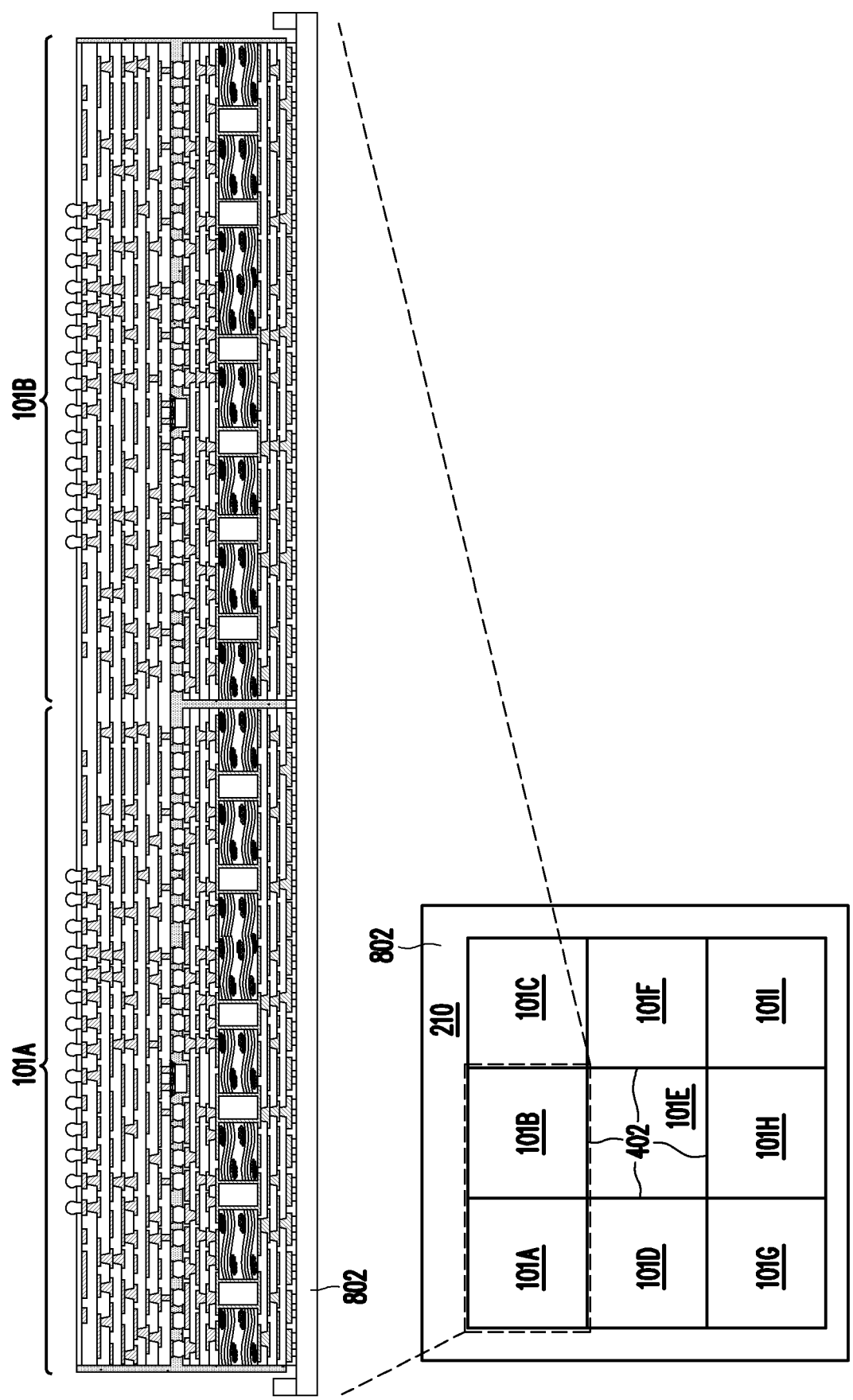
FIG. 17 illustrates a planar view of the layout of package regions on a panel substrate in accordance with some embodiments.

FIG. 17 illustrates the redistribution structure 210 being manufactured using a panel form fabrication process with multiple package regions. In the embodiment shown, nine package regions 101A through 101I are included on the wafer allowing for nine final package components to be fabricated on a single wafer or panel. Fewer or more package regions may be utilized on a single wafer or panel in other embodiments. Subsequent steps in the process use the redistribution structure 210 on a carrier substrate 802 as the base upon which to continue the fabrication process described in further detail below. As described in further detail below, the individual package regions are singulated by sawing along lines 402 and around the perimeter of package regions 101A through 101I.

Figure 18:
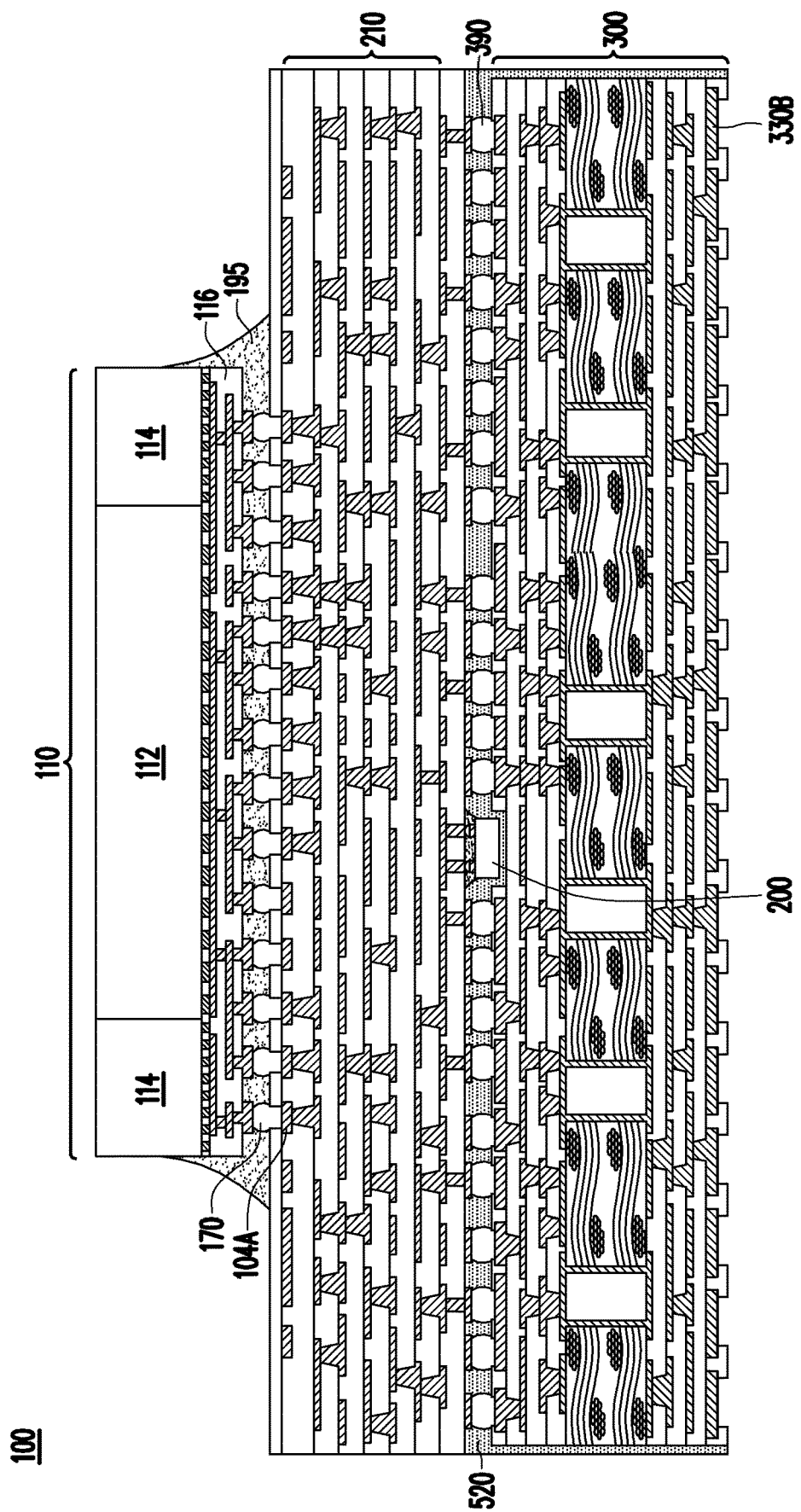

In FIG. 18, a singulation process is performed by sawing along scribe line regions, e.g., between the first package region 101A and the second package region 101B, and an integrated circuit package 110 is attached to the redistribution structure 210. The sawing singulates the first package region 101A from adjacent package regions to form multiple singulated package components 100. As illustrated above in FIG. 15, sidewalls of the core substrate 300 are covered with the encapsulant 520, thereby protecting the sidewalls of the core substrates 300A and 300B during and after singulation. The encapsulant 520 may have a thickness on the sidewalls of the core substrate 300 in a range of 0 µm to 300 µm.

Still referring to FIG. 18, the integrated circuit package 110 may be attached to the redistribution structure 210 through the conductive connectors 170. The conductive connectors 170 attach the integrated circuit package 110 to the contact pads 104A of the redistribution structure 210. Attaching the integrated circuit package 110 may include placing the integrated circuit package 110 on the conductive connectors 170 and reflowing the conductive connectors 170 to physically and electrically couple the integrated circuit package 110 and the redistribution structure 210. The integrated circuit package 110 may include a logic die 112, one or more I/O dies 114 for interfacing with the logic die 112, and a redistribution structure 116, providing electrical pathing and connection between, for example, the logic die 112 and the I/O dies 114, as well as connection from the integrated circuit package 110 to conductive connectors 170. The number, types, and arrangement of dies included in integrated circuit package is not limiting, and alternate dies and arrangements may be utilized in different embodiments.

Multiple integrated circuit packages may be included by repeating the steps described above, in conjunction with the metallization to provide electrical connection to the multiple integrated circuits packages.

In some embodiments, an underfill 195 is formed surrounding the conductive connectors 170 and the integrated circuit package 110. The underfill 195 may reduce stress and protect the joints resulting from the reflowing of the conductive connectors 170. The underfill 195 may be formed by a capillary flow process after the integrated circuit package 110 is attached, or may be formed by a suitable deposition method. In some embodiments, a single layer of underfill 195 is formed beneath multiple adjacent devices, and further subsequent underfills (not shown) may be formed beneath and/or around additional devices placed on top of the redistribution structure 210.

Figure 19:
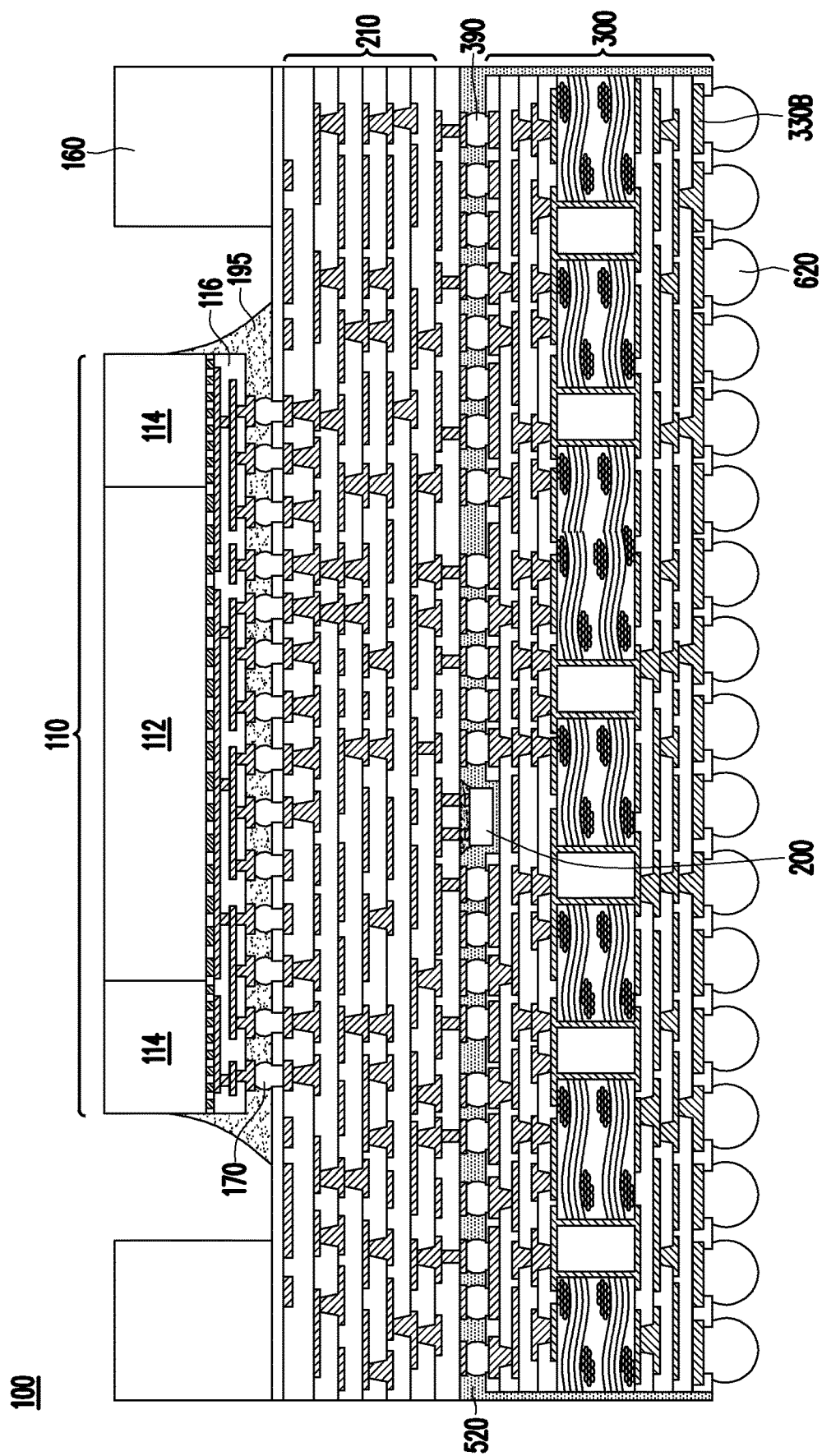

In FIG. 19, a protective ring 160 is mounted on a top surface of the singulated package component 100 and external connectors 620 are formed on a bottom surface of the core substrate 300. The protective ring 160 is mounted to the top of the singulated package component 100, encircling the integrated circuit package 110. In some embodiments the protective ring may be added to provide additional rigidity to the singulated package component and protect the mounted integrated circuit package from physical bumping and knocks that may damage the electrical connection between the integrated circuit package 110 and the redistribution structure 120, or the integrated circuit package 110 itself.

Further referring to FIG. 19, external connectors 620 are formed on the UBMs 330B of the core substrate 300. The external connectors 620 may be ball grid array (BGA) connectors, solder balls, metal pillars, controlled collapse chip connection (C4) bumps, micro bumps, or the like. The external connectors 620 may include a conductive material such as solder, copper, aluminum, gold, nickel, silver, palladium, tin, the like, or a combination thereof. In some embodiments, the external connectors 620 are formed by initially forming a layer of reflowable material on the UBMs 330 through evaporation, electroplating, printing, solder transfer, ball placement, or the like. Once a layer of reflowable material has been formed on the UBMs 330B a reflow may be performed in order to shape the material into the desired bump shapes. In some embodiments, the external connectors 620 are formed with a pitch in a range of 100 µm to 1,500 µm.

Figure 20:
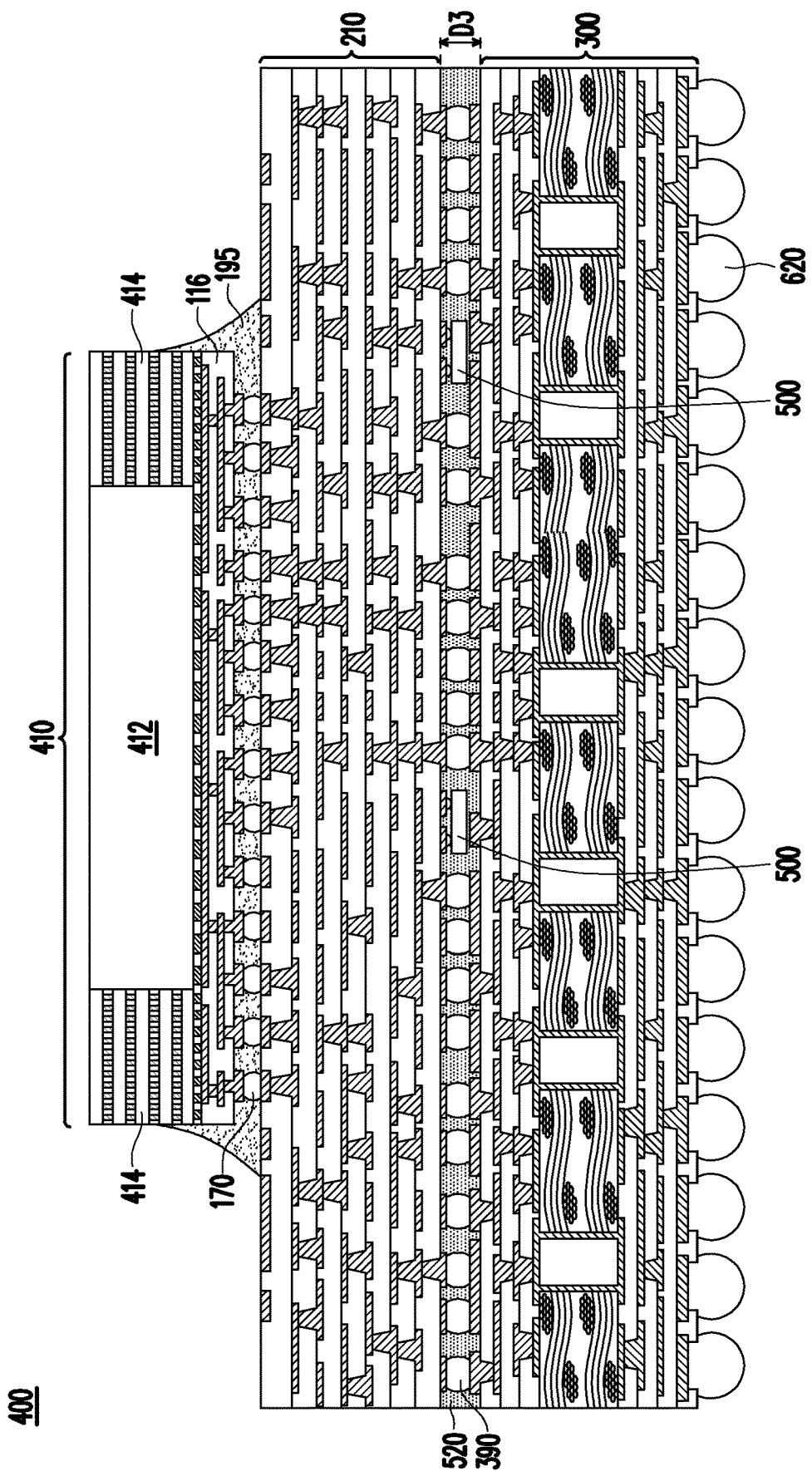
FIG. 20 illustrates a cross-sectional view of a package component in accordance with some embodiments.

FIG. 20 illustrates a cross-sectional view of a singulated package component 400 in accordance with some embodiments. The singulated package component 400 may be similar to the singulated package component 100 described above in reference to FIGS. 1 and 19, where like reference numerals indicate like elements formed using like processes, but with integrated passive device (IPD) chips 500 disposed between the redistribution structure 210 and the core substrate 300 in place of IVRs 200. Although two IPD chips 500 are illustrated, any suitable number of IPD chips 500 may be disposed between the redistribution structure 210 and the core substrate 300. In some embodiments, the IPD chips 500 have thicknesses in a range of 20 µm to 500 µm, and bottom sides of the IPD chips 500 have an area in a range of 2 mm$^2$ to 30 mm$^2$. In some embodiments, the vias 212 and dielectric layer 220 of the singulated package component 100 are omitted and the IPD chips 500 and the conductive connectors 390 are physically and electrically coupled directly to conductive features on the bottom side of the redistribution structure 210.

The redistribution structure 210 and the core substrate 300 of the singulated package component 400 may be separated by a distance D3 in a range of 20 µm to 600 µm, which may be advantageous for having sufficient space to fit the IPD chips 500. A distance D3 less than 20 µm may be disadvantageous for not providing sufficient space to fit the IPD chips 500. A distance D3 greater than 600 µm may be disadvantageous because it may lead to worse connection between the redistribution structure 210 and the core substrate 300 with higher resistance in the conductive connectors 390, which may decrease device performance.

As shown, the integrated circuit package 410 attached to a top surface of the redistribution structure 210 includes a CPU or GPU 412 and two memory dies 414 for illustrative purposes. In some embodiments, the singulated package component 400 does not include a protective ring 160 (see above, FIG. 1), as shown in accordance with FIG. 20. In other embodiments, the protective ring 160 is attached to the redistribution structure 210 as illustrated in FIG. 1 above.

Embodiments may provide advantages. A chip such as an integrated voltage regulator (IVR) or an integrated passive device (IPD) chip may be disposed between a redistribution structure and a core substrate in a system-on-integrated-substrate (SoIS) package. The IVR may supply and regulate power to integrated circuit packages on the redistribution structure. Attaching the IVR to the redistribution structure opposite the integrated circuit package may provide a shortest distance between the IVR and the integrated circuit package that may be useful for providing a more efficient voltage domain with mitigated voltage and power drops. This can improve power integrity for the integrated circuit package and may be able to increase operation frequency and lower supply voltage in order to meet high performance computing (HPC) requirements. A compact system can be achieved that may provide higher SoIS yield due to being fabricated with existing silicon fabrication tools and processes by packaging the IVR between the redistribution structure and the core substrate.

In accordance with an embodiment, a semiconductor device includes: a redistribution structure; an integrated circuit package attached to a first side of the redistribution structure; a core substrate coupled to a second side of the redistribution structure with a first conductive connector and a second conductive connector, the second side being opposite the first side, a top layer of the core substrate including a dielectric material; and a chip disposed between the redistribution structure and the core substrate, the chip being interposed between sidewalls of the dielectric material. In an embodiment, the semiconductor device further includes a dielectric layer on the first side of the redistribution structure; and a first via, a second via, and a third via extending through the dielectric layer. In an embodiment, the chip is physically and electrically coupled to the first via. In an embodiment, the semiconductor device further includes a first under-bump metallurgy (UBM) on the dielectric layer, the first UBM being physically and electrically coupled to the second via, the first conductive connector being physically and electrically coupled to the first UBM; and a second UBM on the dielectric layer, the second UBM being physically and electrically coupled to the third via, the second conductive connector being physically and electrically coupled to the second UBM. In an embodiment, a distance measured between opposite surfaces of the core substrate and the dielectric layer is in a range of 147 µm to 500 µm. In an embodiment, the semiconductor device further includes an encapsulant covering sidewalls of the core substrate, sidewalls of the chip, and a bottom surface of the chip opposite the redistribution structure. In an embodiment, the chip is an internal voltage regulator. In an embodiment, a shortest distance between the chip and the integrated circuit package is less than 0.3 mm.

In accordance with another embodiment, a semiconductor device includes: a first via and a second via extending from a first side of a redistribution structure, an under-bump metallurgy (UBM) on the second via opposite the redistribution structure; a voltage regulator physically and electrically coupled to the first via; an integrated circuit package coupled to the voltage regulator through the redistribution structure, the integrated circuit package on a second side of the redistribution structure opposite the first side; and a core substrate attached to the UBM with a conductive connector, a dielectric material on the core substrate being interposed between the conductive connector and the voltage regulator. In an embodiment, the semiconductor device further includes an underfill interposed between the voltage regulator and the redistribution structure. In an embodiment, a width between the dielectric material and the voltage regulator is in a range of 5 µm to 200 µm. In an embodiment, the voltage regulator has a height in a range of 20 µm to 100 µm. In an embodiment, a bottom side of the voltage regulator has a surface area in a range of 500 µm² to 20,000 µm².

In accordance with yet another embodiment, a method of forming a semiconductor device includes: forming a redistribution structure on a first substrate; attaching a chip to a first side of the redistribution structure; forming an opening in a core substrate; attaching the core substrate to the first side of the redistribution structure, the chip being interposed between sidewalls of the opening; encapsulating the core substrate with an encapsulant, wherein the encapsulant extends along sidewalls of the core substrate, wherein the encapsulant further encapsulates the chip; removing the redistribution structure from the first substrate; and attaching an integrated circuit package to a second side of the redistribution structure, the second side being opposite the first side. In an embodiment, the method further includes: forming a first via and a second via on the redistribution structure; forming a dielectric layer over the redistribution structure, the dielectric layer covering the first via and the second via; and planarizing the dielectric layer to expose a top surface of the first via and a top surface of the second via. In an embodiment, attaching the chip to the first side of the redistribution structure includes physically and electrically coupling a first conductive connector on the chip to the first via. In an embodiment, the method further includes forming an underfill between the chip and the dielectric layer. In an embodiment, the method further includes forming an under-bump metallurgy (UBM) on the dielectric layer, the UBM physically and electrically coupled to the second via. In an embodiment, attaching the core substrate to the first side of the redistribution structure includes coupling a second conductive connector between the UBM and the core substrate. In an embodiment, the method further includes mounting a protective ring on the redistribution structure, the protective ring encircling the integrated circuit package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a redistribution structure;
   an integrated circuit package attached to a first side of the redistribution structure;
   a core substrate coupled to a second side of the redistribution structure with a first conductive connector and a second conductive connector, the second side being opposite the first side, a top layer of the core substrate comprising a dielectric material;
   a chip disposed between the redistribution structure and the core substrate, the chip being interposed between sidewalls of the dielectric material; and
   an encapsulant covering sidewalls of the core substrate, sidewalls of the chip, and a bottom surface of the chip opposite the redistribution structure.

2. The semiconductor device of claim 1, further comprising:
   a dielectric layer on the first side of the redistribution structure; and
   a first via, a second via, and a third via extending through the dielectric layer.

3. The semiconductor device of claim 2, wherein the chip is physically and electrically coupled to the first via.

4. The semiconductor device of claim 2, further comprising:
   a first under-bump metallurgy (UBM) on the dielectric layer, the first UBM being physically and electrically coupled to the second via, the first conductive connector being physically and electrically coupled to the first UBM; and
   a second UBM on the dielectric layer, the second UBM being physically and electrically coupled to the third via, the second conductive connector being physically and electrically coupled to the second UBM.

5. The semiconductor device of claim 2, wherein a distance measured between opposite surfaces of the core substrate and the dielectric layer is in a range of 147 μm to 500 μm.

6. The semiconductor device of claim 1, wherein the chip is an internal voltage regulator.

7. The semiconductor device of claim 1, wherein a shortest distance between the chip and the integrated circuit package is less than 0.3 mm.

8. A semiconductor device, comprising:
   a first via and a second via extending from a first side of a redistribution structure, an under-bump metallurgy (UBM) on the second via opposite the redistribution structure;
   a voltage regulator physically and electrically coupled to the first via;
   an integrated circuit package coupled to the voltage regulator through the redistribution structure, the integrated circuit package on a second side of the redistribution structure opposite the first side; and
   a core substrate attached to the UBM with a conductive connector, a dielectric material on the core substrate being interposed between the conductive connector and the voltage regulator.

9. The semiconductor device of claim 8, further comprising an underfill interposed between the voltage regulator and the redistribution structure.

10. The semiconductor device of claim 8, wherein a width between the dielectric material and the voltage regulator is in a range of 5 μm to 200 μm.

11. The semiconductor device of claim 8, wherein the voltage regulator has a height in a range of 20 μm to 100 μm.

12. The semiconductor device of claim 8, wherein a bottom side of the voltage regulator has a surface area in a range of 500 $μm^2$ to 20,000 $μm^2$.

13. A semiconductor device, comprising:
   a redistribution structure;
   a core substrate on a first side of the redistribution structure, wherein the redistribution structure is coupled to the core substrate by a conductive connector, wherein the conductive connector comprises solder, and wherein the conductive connector extends partially through a dielectric layer of the core substrate;
   a chip coupled to the first side of the redistribution structure, wherein the chip is between the redistribution structure and the core substrate, wherein the chip is beside the conductive connector, and wherein a bottom surface of the chip is below a top surface of the dielectric layer of the core substrate; and
   an integrated circuit package on a second side of the redistribution structure opposite the first side.

14. The semiconductor device of claim 13, further comprising an encapsulant between the core substrate and the redistribution structure, wherein the encapsulant is between a sidewall of the chip and a sidewall of the dielectric layer of the core substrate.

15. The semiconductor device of claim 14, wherein the encapsulant is between the bottom surface of the chip and a top surface of the core substrate.

16. The semiconductor device of claim 13, wherein the chip is a voltage regulator.

17. The semiconductor device of claim 13, wherein the chip is spaced apart from the integrated circuit package by a distance smaller than 0.3 mm.

18. The semiconductor device of claim 13, wherein the core substrate is spaced apart from the redistribution structure by a distance larger than 147 μm.

19. The semiconductor device of claim 13, further comprising a protective ring on the second side of the redistribution structure, wherein the protective ring encircles the integrated circuit package.

20. The semiconductor device of claim 1, further comprising an underfill between the chip and the redistribution structure.

* * * * *